United States Patent [19]

Lallement

[11] 4,037,957
[45] July 26, 1977

[54] METHOD AND MACHINE FOR THE PRODUCTION OF A SERIGRAPHIC SCREEN BY THE PHOTOCHEMICAL METHOD

[75] Inventor: Bernard Lallement, Troyes, France

[73] Assignee: Vitos Etablissements Vitoux, Aube, France

[21] Appl. No.: 561,889

[22] Filed: Mar. 25, 1975

[30] Foreign Application Priority Data

Apr. 4, 1974  France ............................... 74.11960
Mar. 14, 1975  France ............................... 75.08019

[51] Int. Cl.² ........................................... G03B 27/20
[52] U.S. Cl. ....................................... 355/91; 355/104; 355/110
[58] Field of Search ............... 355/91, 87, 92, 110, 355/104; 96/35, 37, 38

[56] References Cited

U.S. PATENT DOCUMENTS

| | | | |
|---|---|---|---|
| 3,574,460 | 4/1971 | Snaper | 355/91 |
| 3,622,241 | 11/1971 | Dexter | 355/91 |
| 3,639,060 | 2/1972 | Jaskowsky | 355/104 |
| 3,694,080 | 9/1972 | Malsky | 355/104 |
| 3,728,024 | 4/1973 | Nagai | 355/104 |

*Primary Examiner*—Stephen J. Tomsky
*Attorney, Agent, or Firm*—Toren, McGeady and Stanger

[57] ABSTRACT

Method for the production of a serigraphic screen by the photochemical method, characterized by the fact that, starting from a blank tubular screen obtained by tubular weaving or by closing a flat fabric on itself, one at least of the faces of the screen is coated with a photosensitive film, against the screen is placed a transparent tubular masking film bearing the design to be printed in ink in opaque zones, stretching the masking film and the screen axially and radially, under the conditions of tension wherein the finished screen will be used for the printing, urging the screen and the masking film against one another, and exposing to actinic rays, on the side of the masking film, the assembly of the superimposed masking film and screen, the photosensitive film being then removed by washing in the zones of the screen covered by the opaque zones of the masking film during exposure, while it remains in the irradiated zones.

23 Claims, 8 Drawing Figures

METHOD AND MACHINE FOR THE PRODUCTION OF A SERIGRAPHIC SCREEN BY THE PHOTOCHEMICAL METHOD

The invention relates to screens for serigraphic printing.

It relates to the manufacture of screens by the photochemical method. This method consists, for flat screens, of coating the screen with a photosensitive film, covering the screen with a positive mask, or masking film, which is transparent, except in the zones corresponding to the design to be produced in ink by the screen, in exposing the film and the screen on the masking film side to actinic rays so that the screen is only exposed in the zones corresponding to the non-opaque zones of the film, and in removing from the screen, by washing with water, the unactivated photosensitive portions of film corresponding to the opaque zones of the masking film whilst the rest of the photosensitive film, activated by the radiation, is insoluble and remains on the screen.

A flat screen is thus obtained whose meshes are occluded in the zones which are not to be printed and which are open in the zones which the ink must traverse for printing.

This method gives full satisfaction as regards fineness of resproduction of the drawings, but it presents a difficulty which resides in that it can only be used at present on flat screens. The screen and the masking film are superimposed flat on a surface and exposed to the light in the position. For discontinuous printing, using a flat screen, this drawback is of no consequence. On the other hand, for continuous printing, using a tubular screen, this drawback has the result that the flat screen, produced according to the above method, must be closed on itself, which is manifested by faults of continuity of the design at the joint between the two free edges of the screen.

To overcome this drawback, it has been proposed to first produce a blank tubular screen, to mount it on a support and to subject the assembly to actinic radiation. This method, if it avoids the foregoing faults in joining up, possesses however the drawback, on subsequent printing, that the screen is deformed with respect to its condition on its subjection to actinic radiation, with the result that the shape of the design of motif reproduced is modified with respect to the model.

It is an object of the invention to provide a method and a machine for the production of tubular serigraphic screens by the photochemical method, which are free of the above mentioned drawbacks.

To this end, the method according to the invention is characterized by the fact that, starting from a blank tubular screen obtained by tubular weaving or by closing a flat fabric on itself, one at least of the surfaces of the screen is coated with a photosensitive film, a transparent tubular masking film is placed against the screen, said masking film bearing in opaque zones the design to be printed in ink, the masking film and the screen are stretched axially and radially under the conditions of tension in which the finished screen will be used for printing, the screen and the masking film being urged against one another, and the superimposed assembly of the masking film and screen are irradiated with actinic rays, on the side of the film, the photosensitive film being then removed by washing in the zones of the screen covered by the opaque zones of the masking film during its exposure to radiation, whilst it remains in the zones exposed to radiation.

The machine according to the invention is characterized by the fact that it comprises: means for supporting a virgin or blank tubular screen obtained by tubular weaving or by closing a flat fabric on itself; means for urging against the screen a tubular mask bearing in opaque zones the design to be printed in ink; means for axially and radially stretching the mask and screen under the conditions of tension wherein the finished screen will be used for printing; and means for subjecting, on the side of the masking film, the assembly of the superimposed masking film and screen to actinic radiation so that only the parts of the screen, initially coated with a photosensitive film, corresponding to the transparent zones of the masking film are affected.

There is thus obtained a screen which has been subjected to the operation of exposure to light under the conditions of tension wherein it will be used for printing, which eliminates any risk of the faults in reproduction mentioned above.

The invention will be well understood by means of the description which follows and with reference to the accompanying drawings in which.

The machine according to the invention, shown in the drawings, is enclosed in a casing 1. On the panel 2 of the casing are located the various control and monitoring members for its operation, of which certain will be described subsequently. Inside the casing is provided an actinic ray lamp 3, for example an ultra-violet ray lamp.

The lamp 3 is for illuminating a serigraphic screen 4, generally called a silk screen, which is in tubular form. This form may be obtained, in known manner, either by tubular weaving or by closing back on itself by gluing of a flat fabric. The screen may carry two endless lateral belts 5 for driving it and placing it under tension during printing.

Before undergoing the treatment of exposure to light, the screen is coated, in known manner for serigraphic screens, with a film of photosensitive gelatin on its two surfaces.

To cooperate with the screen 4 during exposure, a transparent, positive mask or film 6 is provided, on which have been applied, in known manner, opaque zones corresponding to the drawing to be reproduced in ink by the finished screen. The masking film 6 is also in tubular form and has a perimeter substantially equal to that of the screen 4, whilst its width may be less, as shown in FIGS. 2 and 5.

To support the screen 4 and the film 6, the machine comprises a cylindrical mandrel or drum 7 which is rotatably and slidably mounted.

Figure 2:
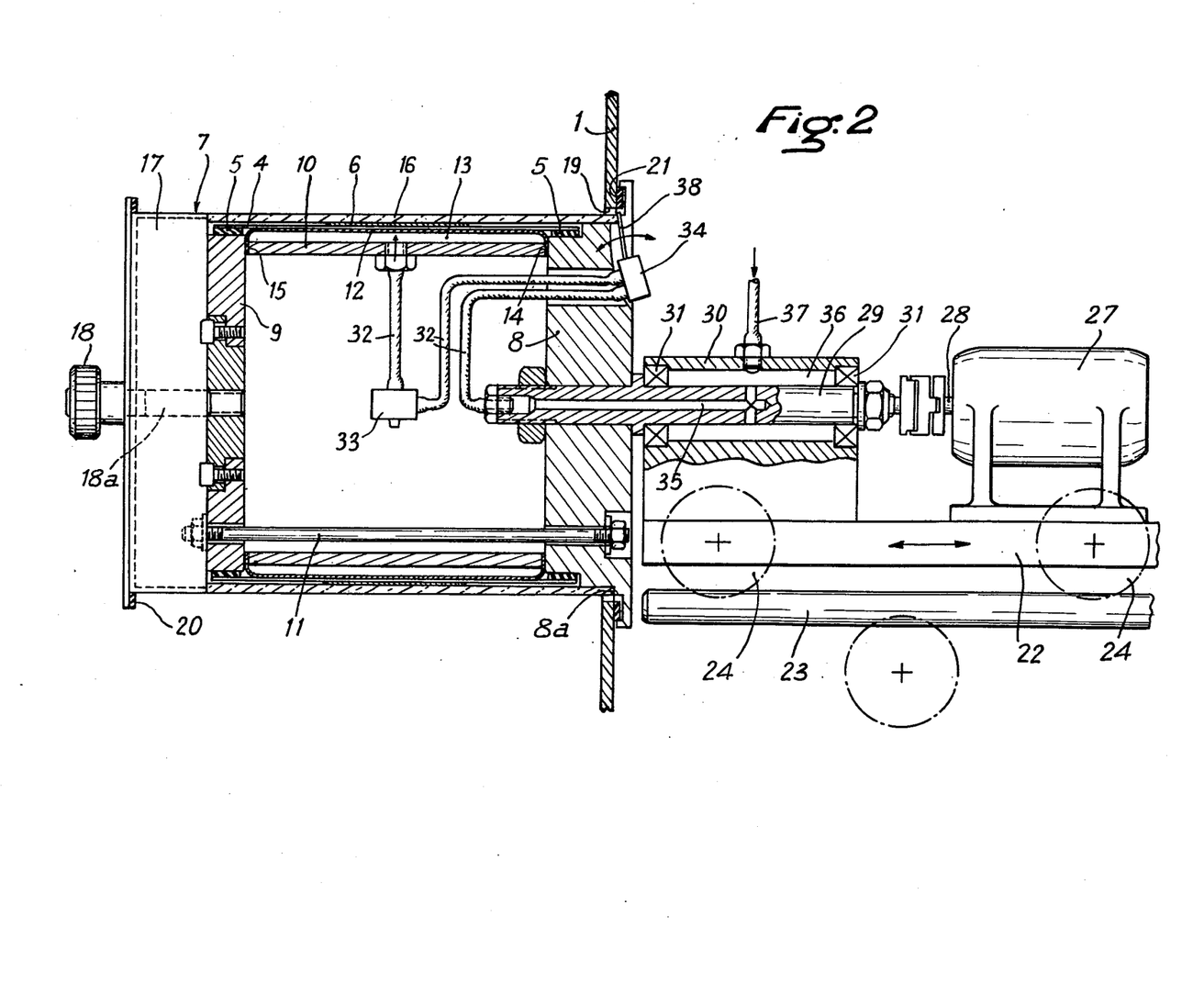
FIG. 2 is a vertical section of a portion of the machine of FIG. 1.
Figure 5:
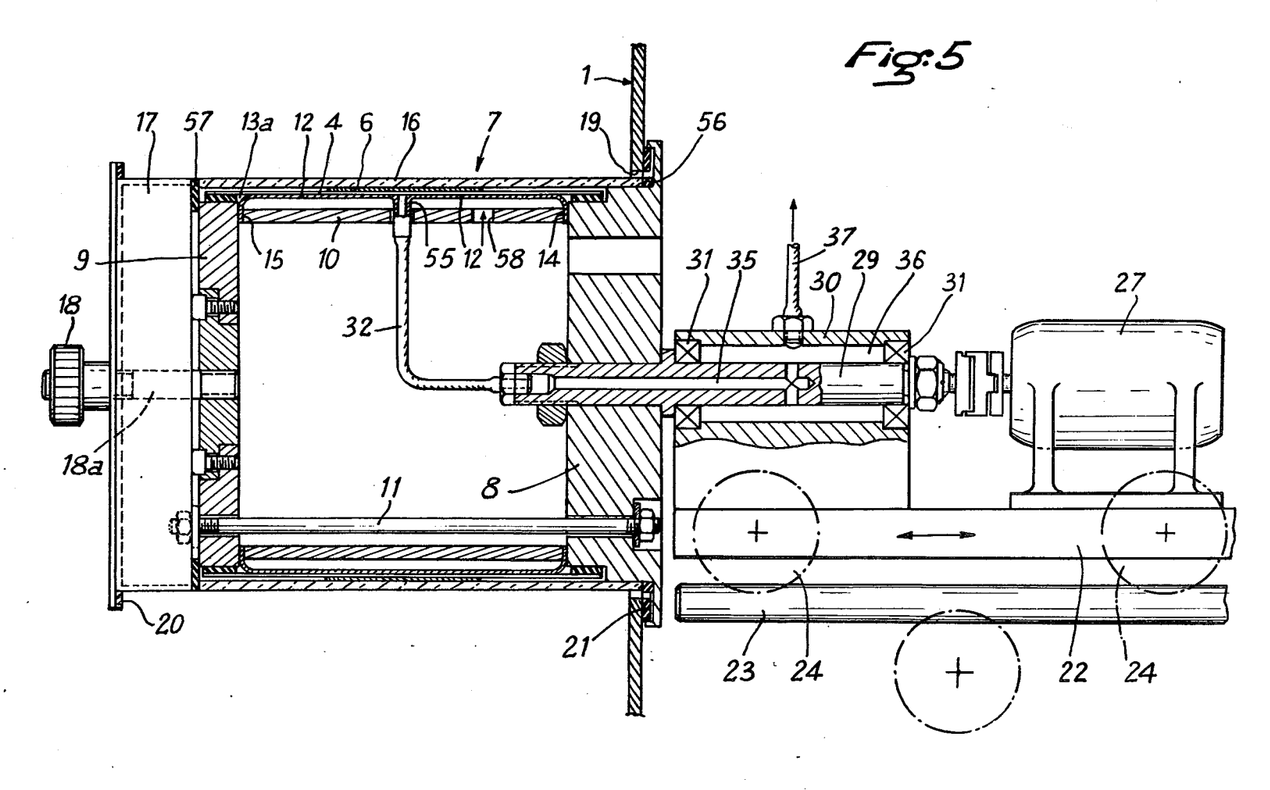
FIG. 5 shows in section a modification of the machine according to the invention.

The mandrel 7 has two end radial flanges 8, 9 fastened together by a spacing ring 10 and bolts 11 of which one only is shown in FIG. 2 and 5. Around the ring 10 is provided a diaphragm 12 which extends between the two flanges 8, 9 and which defines with the ring 10 a chamber 13 (FIG. 2) hermetically closed at the level of the flanges, for example by pinching of its lateral edges 14, 15 between the ring and the flanges. The flanges overlap the ring 10 and the diaphragm 12 to offer support surfaces for the edges of the screen 4.

A transparent cylindrical sleeve 16, which is of an inextensible material but which can be flexible, is provided so that it can be slipped over the mandrel 7 and so that it is supported by a collar 8a of the inner flange 8. Preferably, the sleeve 16 is rigid and is constituted of glass or of plastics.

The diameter of the sleeve is adapted very accurately to the perimeter of the screen 4 when the latter is stretched under the conditions of use for printing.

For holding the sleeve 16 in place, an end cover 17 is provided and it is clamped axially against the sleeve by a knurled nut 18 cooperating with an axial screw 18a carried by the outer flange 9.

Figure 1:
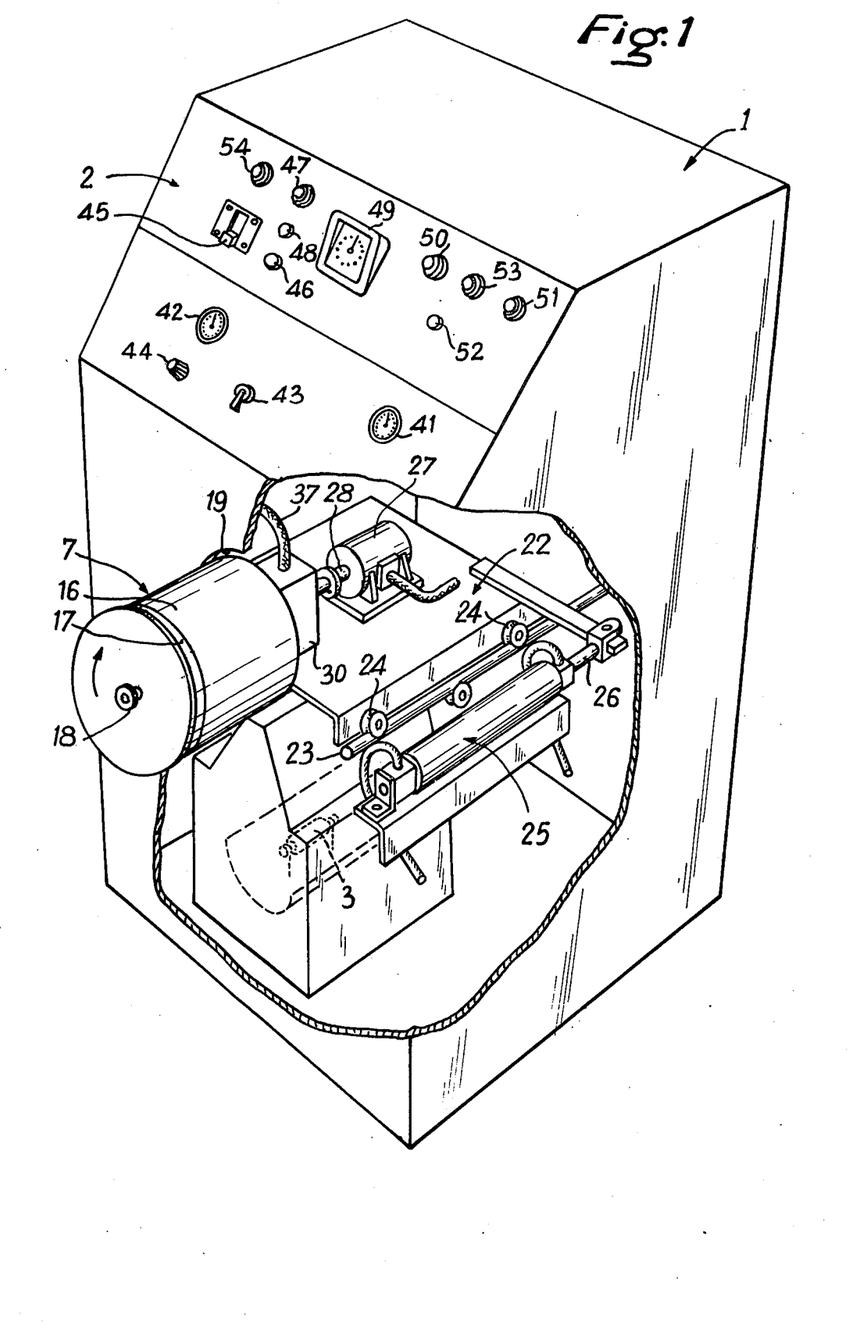
FIG. 1 is a cutaway perspective view showing the essential members of the machine in its condition before the exposure to light.
Figure 3:
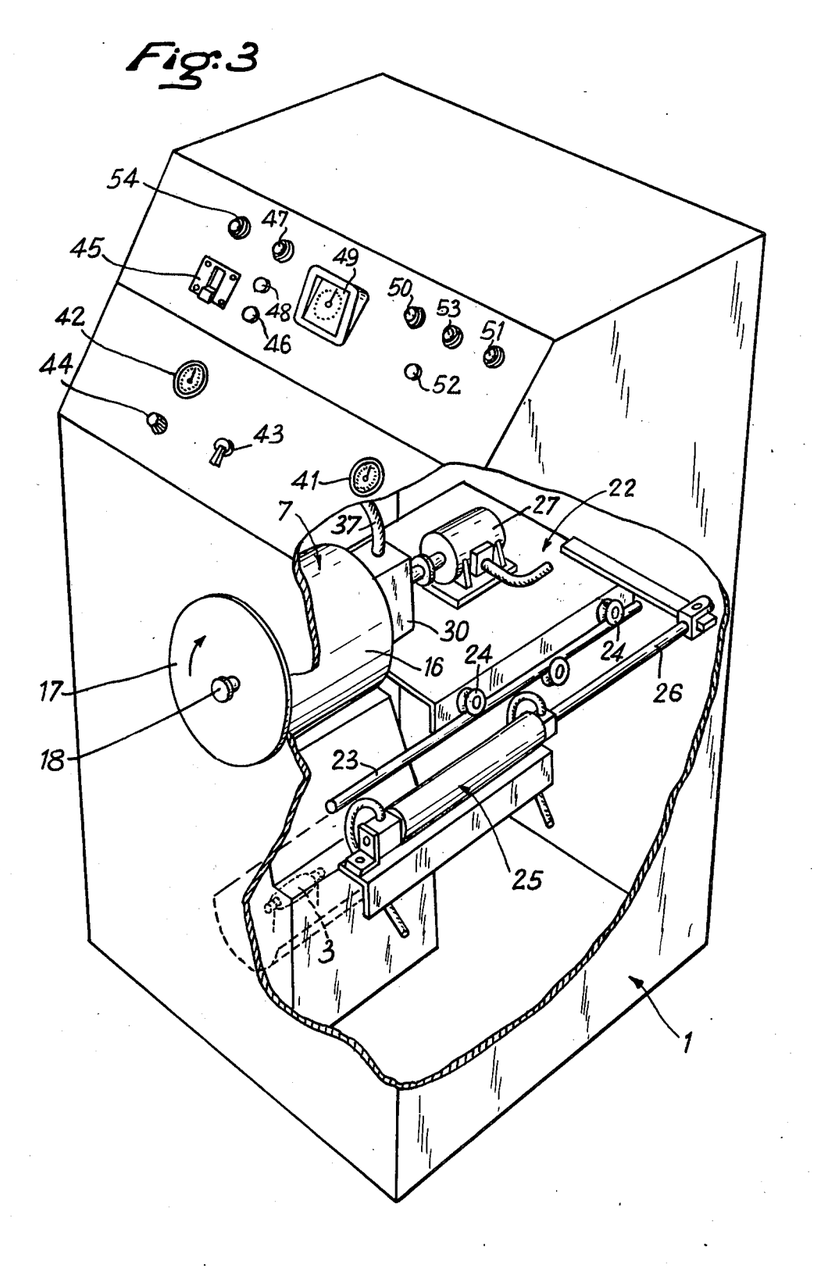
FIG. 3 shows the machine of FIG. 1 in its condition during exposure to light.

The mandrel 7 is mounted so as to slide axially between an emerged position (FIG. 1, 2 and 5) for which it is accessible from the outside of the machine and a retracted position (FIG. 3) for which it is totally withdrawn into the machine and for which the cover 17 closes a circular opening 19 formed in the front wall of the casing 1.

To avoid ultra-violet rays emitted by the lamp 3 from being able to escape from the casing, the cover 17 is provided with an annular seal 20 supported against the inner surface of the casing when the mandrel is in emerged position, for heating the machine and mandred assembly.

The mandrel 7 is supported by a carriage 22 which can slide along horizontal rails 23, by means of rollers 24, through actuation by a pneumatic jack 25 whose rod 26 is coupled to the carriage. The carriage 22 supports an electric motor 27 whose output shaft 28 is coupled to a shaft 29 coaxially fast to the inner flange 8 of the mandrel. The shaft 29 is carried by a support part 30, fixed to the carriage, through bearings 31.

The positioning of the screen 4 and of the film 6 is effected in the following manner. The nut 18, the cover 17 and the sleeve 16 being withdrawn, the tubular screen 4, previously coated on its outer surface with a film of photosensitive gelatin which is allowed to dry, is threaded axially and freely on to the mandrel 7 so that its edges come to rest on the flanges; the tubular film 6 is then threaded on to the screen and positioned axially so that its opaque zones occupy the desired positions with respect to the screen 4; the transparent tubular sleeve 16 is then threaded on to the film so that it becomes supported on the shoulder 8a of a flange 8; finally, the sleeve 16 is locked axially and radially by means of the cover 17 which comes to abut against the edge of the sleeve, the cover being moved by the knurled nut 18.

In order to hold screen 4, on the one hand, under radial and axial tension and, on the other hand, in close contact with the film 6 during exposure, the film and the screen are urged against the inner surface of the sleeve 16 whilst an axial tension is exerted on the screen during the phase of supporting the screen on the sleeve.

For this, in the embodiment of FIG. 2, an excess pressure is established in the chamber 13 whilst, in the embodiment of FIG. 5, suction is established between the diaphragm 12 and the cylinder 16.

Figure 4:
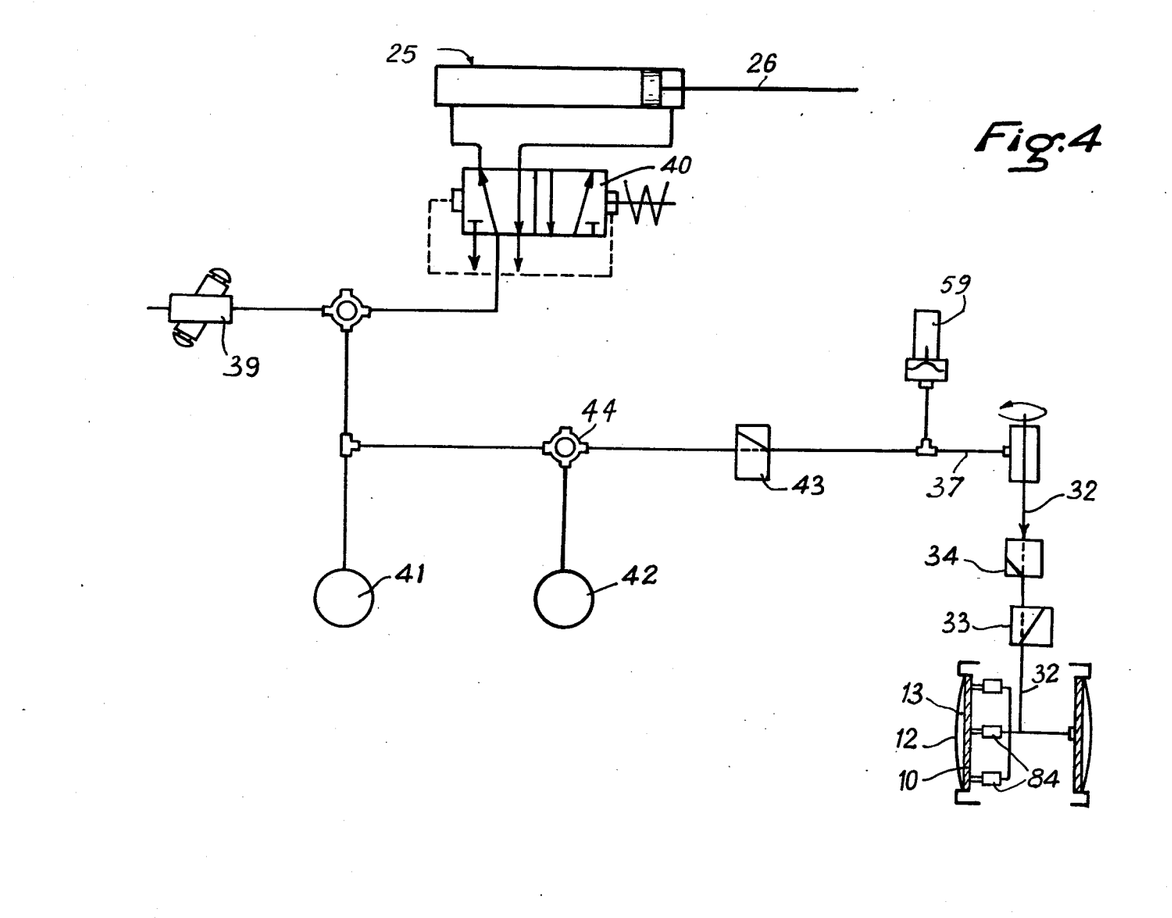
FIG. 4 shows diagramatically the pneumatic circuit of the machine of FIG. 1 to 3.

As shwn in FIG. 2 and 4, the chamber 13 communicates with a duct 32 which traverses the ring 10 radially. On the duct 32 are provided a rapid release deflating valve 33 and a safety valve 34.

The duct 32 opens into a channel 35 formed in the shaft 29. The channel 35 opens radially into a chamber 36 formed in the support part 30. The chamber 36 is made hermetic by the use of the fluid tight seals 31. The chamber 36 communicates with a flexible pipe 37 for introducing compressed air from a suitable source (not shown).

The safety valve 34 has the purpose of preventing bursting the diaphragm 12, and eventually of the screen and of the film, when the sleeve 16 is not in position, if compressed air is admitted through a false manoeuvre into the chamber 13. Valve 34 includes a control finger 38 which is only depressed, in opening the valve, if the sleeve 16 is in the inserted position for which it limits inflating of the chamber 13. The exhaust valve 33, of known construction, has the function of automatically placing the chamber 13 in communication with the atmosphere when the compressed air coming from the flexible pipe 37 is cut off.

Duct 32 opens substantially at the middle of the axial length of the chamber 13. When air under pressure is introduced into the chamber 13, it is firstly the central annular portion of the diaphragm 12, that is to say the most flexible portion, which is deformed first, urging the screen and the film radially against the sleeve 16. Gradually, the remainder of the diaphragm is deformed, on each side of the central portion, urging the screen and the film against the sleeve but also stretching the screen axially which thus takes up the mechanical conditions of use in printing. The risk of folds on the screen is nil since the screen, coated with the film, is relatively rigid.

As shown in FIG. 4, the pneumatic circuit of the machine includes a manual valve 36 for the general pressurization of the machine, an electrovalve 40 for supplying the double acting jack 25 for the movement of the carriage 22, a jack pressure manometer 41, an inflation manometer 42 of the chamber 13, a manual inflation valve 43 of the chamber 13 and a safety manostat 59 preventing re-entry of the mandrel as long as the chamber 13 is not inflated.

Those members of the pneumatic circuit which are controlled by the operator or which have a signalling function are visible on the panel 2 (FIGS. 1 and 3), except the valve 39, and are indicated by the same references as in FIG. 4.

The electric circuit of the machine will not be described. Below, only the members of the electric circuit will be indicated which are controlled by the operator or which have display function; these members are also present on panel 2 and are constituted by: a general switch 45; a button 46 for lighting the lamp 3, with a pilot lamp 47; a button 48 for extinguishing the lamp; an adjustable time switch 49 defihing the time of exposure; a pilot lamp 50 lighting, for the first cycle, at the end of the placing of the lamp in operating condition; a pilot lamp 51 for the pressurization of the chamber 13; a starting button for the illumination cycle; a pilot lamp 53 indicating the end of the illumination cycle; and a pilot lamp 54 indicating the end of ventilation after the illumination.

The use and operation of the machine are as follows. When the mandrel 7 has been lined with the screen 4, the film 6 and the sleeve 16, as indicated above, the operator, after having placed the machine under tension and under pressure, having lit the lamp 3 by manipulating the button 46, having adjusted the time switch 49 and the inflation pressure of the chamber 13 by the button 44, and having inflated the diaphragm 12 by manipulating the button 43, depresses the button 52 which causes, on the one hand, the continuous rotation of the mandrel indicated by the arrow and, on the other hand, if the chamber 13 is well inflated and if the placing in operation of the member is terminated, the re-entry of the mandrel by the jack 25. During the rotation of the mandrel, the screen 4 is subjected to radiation, from the outside of the mandrel, except in the areas covered by the opaque zones of the film. In the irradiated areas, the gelatin is activated whilst, in the other areas, it remains intact.

At the end of the time of illumination defined by the time switch 49, the jack 25 is actuated to cause the mandrel to re-emerge; the motor stops and the pilot lamp 53 lights.

The operator has then only to remove the sleeve 16 from the mandrel, the screen 4 and the film 6. The screen is then washed with water to remove the unactivated gelatin in the areas initially covered by the opaque zones of the film. The screen then has, at the end of treatment, areas where the meshes are clogged by the activated gelatin and areas where the meshes are free, like the original screen, for the passage of ink during printing.

It is to be noted that at any moment, the radiation of the lamp 3 cannot escape from the casing, which constitutes a protection for the operator and for screens already irradiated or to be irradiated which can thus be handled without the lamp having to be extinguished.

In FIG. 5 a modification of the pneumatic means for urging the film 6 against the screen 4 and for stretching the screen are shown. In this figure, the same reference numerals are used for similar elements as in FIGS. 1 to 4 to which reference will be made.

In this modification, suction is produced between the diaphragm 12 and the sleeve 16. The diaphragm 12 bears a connector 55 on which is attached the duct 32 which opens directly into the channel 35 of the shaft 29. The chamber 13a defined by the diaphragm 12 and the sleeve 16 is rendered hermetic, when the sleeve is in position, by two flat annular seals 56, 57. The seal 56 is arranged between the inner end of the sleeve and a shoulder of the inner flange. The seal 57 is arranged between the cover 17, the outer end of the sleeve and the outer surface of the outer flange 9. The assembly of the mandrel 7 is affected in the same way as previously, with, in addition, the mounting of the seals 56, 57.

For deformation of the diaphragm 12, the air present in the chamber 13a is sucked through the connector 55 and the duct 32 from the flexible pipe 37. The diaphragm deforms radially outwardly. A vent 58 enables the air to pass through the spacing ring 10.

In the embodiments of FIGS. 1 to 5, the stretching action is done by circulation of air over the woven fabric constituting the screen; while it follows that this axial stretching is relatively weak; it is however suitable in cases where, on subsequent printing using the produced screen, the axial tension given to the screen is also relatively weak.

Figure 6:
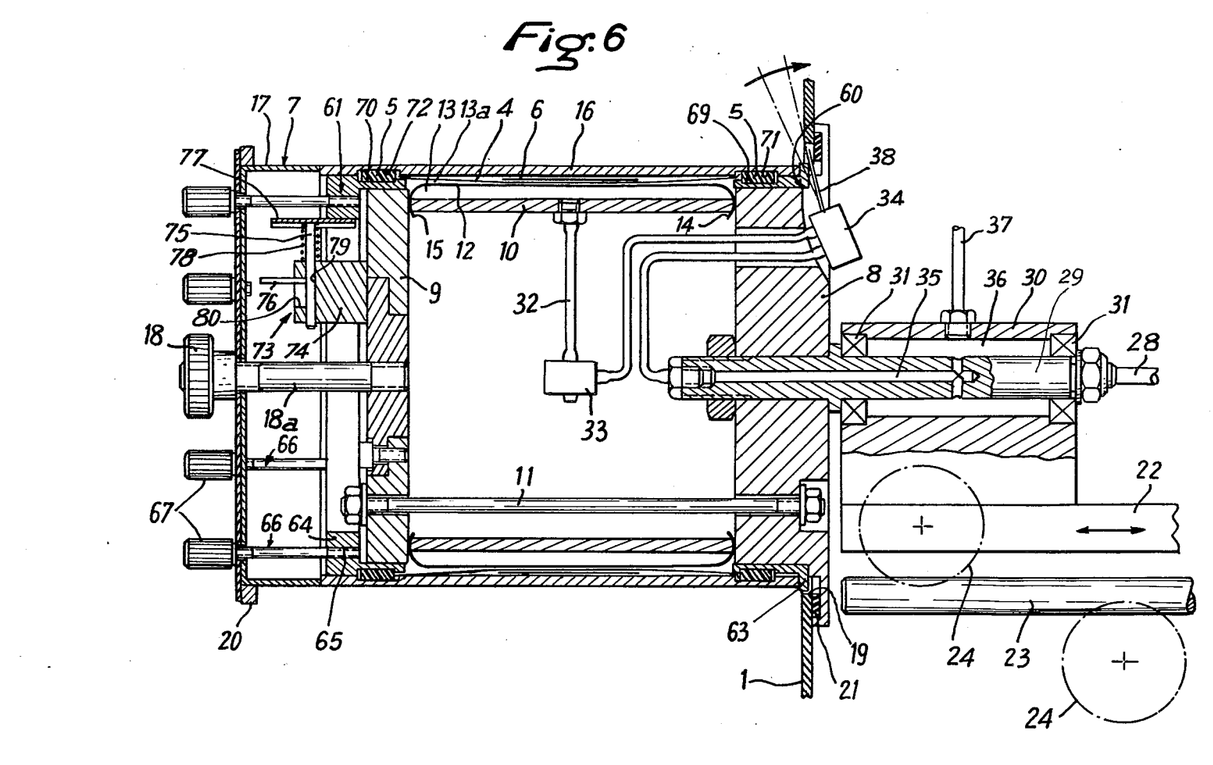
FIG. 6 is a vertical section of a portion of a machine according to the invention.
Figure 7:
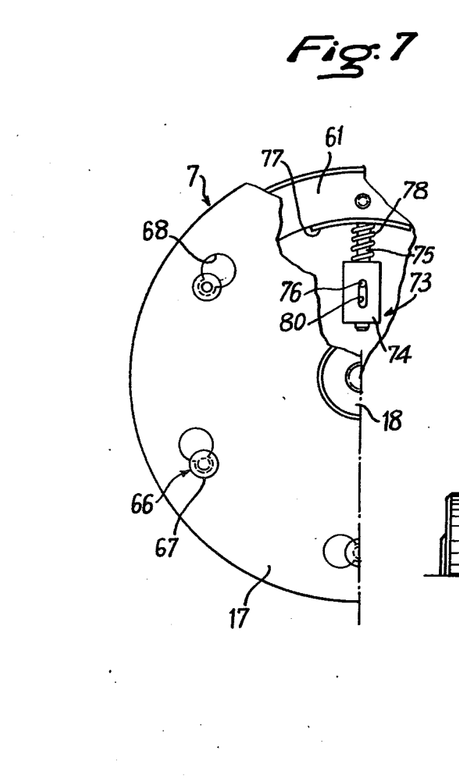
FIG. 7 is a side view, with part cut away, of a portion of the machine of FIG. 6.
Figure 8:
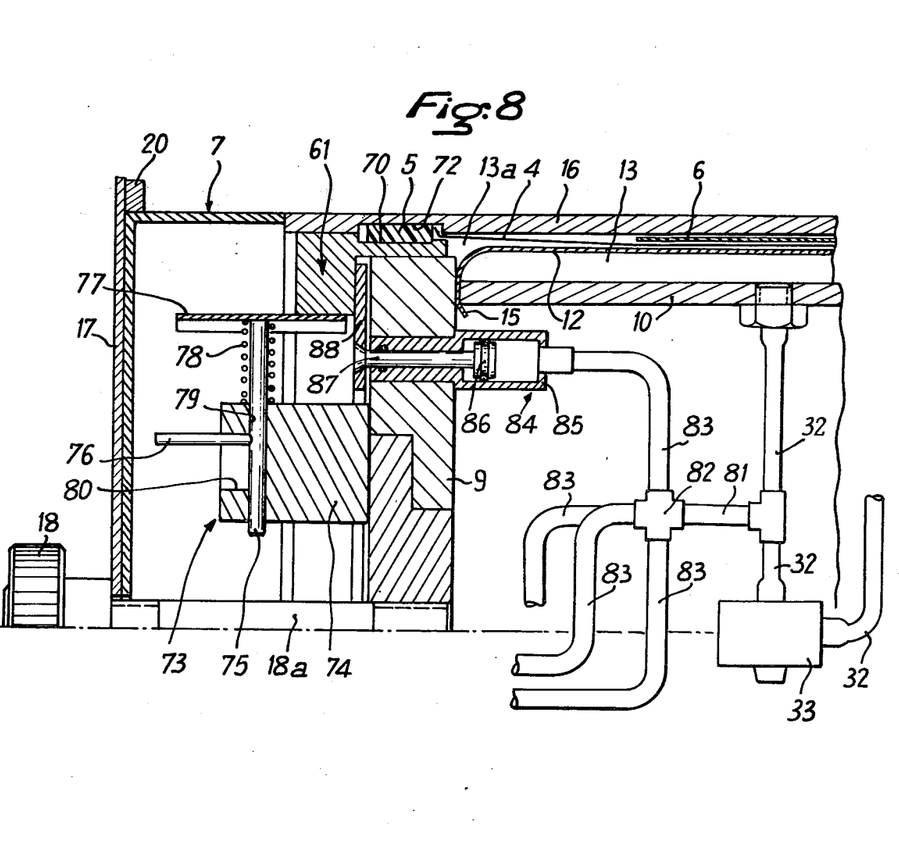
FIG. 8 is a partial view in vertical section of a machine according to a modification.

In cases where the axial tension applied on printing is higher, use is advantageously made of the embodiments of FIG. 6 to 8.

These embodiments only differ from that of FIG. 1 to 4 in the means for placing the screen under axial tension. For this reason, only said means will be described and, for the remainder, reference will be made to the description which has already been given.

The embodiment of FIGS. 6 and 7 will first be described.

To support the screen 4 and to enable its placing under axial tension, the machine comprises two co-axial rings 60, 61. Rings 60 and 61 are arranged to be freely threadable on the flanges 8 and 9. The ring 60 includes an outer collar 63 intended notably to come into axial abutment against the transparent sleeve 16. The ring 61 comprises a thick inner collar 64 having a plurality of axial threaded holes 65 to receive screws 66. The heads 67 of the screws 66 are situated outside the cover 70. The latter has button-hole openings 68 for the passage of the head 67 on the assembly of the mandrel 7. For this purpose, the button-holes 68 have a wide portion for the passage of the head 67 and a narrow portion for the passage of the screw shanks.

To support the screen 4 by its lateral belts 5, the rings 60, 61 each have an outwardly turned annular groove 69, 70. The grooves 69, 70 have substantially the same width as the belts and have a depth less than the thickness of the belts. Facing the grooves 69, 70, the sleeve 16 has itself also two grooves 71, 72, which have a greater width than the belts and a depth such that, added to that of the grooves 69, 70, it corresponds to the thickness of the belts.

Preferably, for reasons of ease of assembly, the rings 60, 61 are each in two semi-circular portions. To hold the two portions of the ring 61 in position, on assembly, two diametrically opposite supports with elastic action 73 are preferably provided, of which only one is shown in FIGS. 6 and 7. A support 73 includes a body 74, fitted to the flange 9 by any means, for example by bolting, a sliding radial rod 75 with an actuating finger 76, a circular arc shoe 77 carried by the outer end of the rod 75 and a spring 78 urging the rod 75 and the shoe 77 outwardly. The rod 75 slides in a radial bore 79 and the finger 76 moves in a window 80 opening into the bore 79.

The positioning of the screen 4 and the film 6 is done in the following manner: the mandrel 16 being withdrawn from the machine, the film 6 and the screen 4 are placed inside the sleeve the film placed between the screen and the sleeve and the belts 5 being arranged in the inner grooves 71, 72 of the sleeve. The two parts of the ring 60 are positioned successively to receive the corresponding belt 5 through their groove 71.

The sub-assembly thus mounted is threaded onto the mandrel 7 until the belt 5 engaged in the groove 72 comes into the vicinity of the flange 9. The two parts of the ring 61, bearing the screws 66, are then positioned successively to receive the corresponding belt 5 and are held temporarily by the shoe 77 with elastic action which will be manually maintained in retracted position, by the effect of the finger 76. The shoes thus maintain the ring 61 in a position with respect to the flange 9. The sleeve, with the two rings 60, 61, the film 6 and the screen 4 are fully threaded onto the mandrel; the ring 61 is then supported by the flange 9. The operator positions the cover 17 by passing the heads of the screws 67 through the large portion of the button-hole 68, then he turns the cover slightly to engage the narrow portion of the button-holes around the screw shanks to provide the head 67 with a support surface. Cover 17 bears axially against the edge of the sleeve against which it is urged when the operator locks the nut 18. This locking also causes the other end of the sleeve to bear against the collar 63 of the flange 8. The sleeve 16, the film 6 and the screen 4 are thus positioned on the mandrel 7.

To stretch the screen axially, it suffices to rotate the screw head 67 successively. This manoeuvre causes sliding of the ring 61 towards the cover and hence the axial spacing of the belts 5. This spacing is rendered possible by the fact that the grooves 71, 72, formed on the inner surface of the sleeve 16, are wider than the belts. Of course, the axial distance between these grooves is calculated so that the belts 5 can have this movement of separation.

The safety valve 34, which has the function of preventing the bursting of the diaphragm 12, and eventually of the screen and of the film, when the sleeve 16 is not in position, if compressed air is introduced by a false manoeuver into the chamber 13 is indentical with that of FIG. 2 but its control finger 38 is actuated by the collar 63 of the ring 60, and no longer by the sleeve 16 itself, on opening the valve, only if the sleeve 16 is in the inserted axial position in which it limits the inflation of the chamber 13.

When the screen is thus stretched axially and radially, the carriage 22 is again in the casing for the exposure operation which has been described previously. It will be recalled only that the mandrel is rotated and that the screen is subjected to actinic radiation which renders the gelatin coating covering the screen insoluble in water, in the areas outside the opaque zones of the film. After exposure, the screen is washed with water so that only the meshes not covered by the opaque areas of the film remain clogged.

The modification of FIG. 8, which has already been partly described, differs from the embodiment of FIGS. 6 and 7 by the means employed to move the ring 61 axially. These means are of the pneumatic type, whilst those of FIGS. 6 and 7 are of the mechanical type.

On the duct 32, between the valve 33 and the chamber 13 (see also FIG. 4), is connected a pipe 81 which supplies a distributing connector 82. From the connector 82 extend for example four pipes 83 which each supply a single-acting jack 84 of which only one is shown. Each jack includes a body 85, fast to the inner surface of the flange 9, a piston 86 and a piston rod 87 passing through the flange 9 in axial direction. The four jacks 84 are arranged at right angles and their rods bear, on the side of the ring 61, a ring 88 coaxial with the ring 61 and with the flange 9. The peripheral portion of the ring 88 is in facial engagement with the ring 61.

The positioning of the sleeve 16, with the screen 4 and the film 6, is done as previously. The ring 61 is then mounted first on the shoes 77, and then on the flange 9. The cover 17 is positioned and locked by the nut 18, which immobilises the sleeve 16.

The placing of the screen under axial and radial tension is done by introducing air under pressure into the chamber 13 and into the four jacks 84 which, through the ring 88 and the ring 61, separate the belts 5 axially.

It is possible to use the means of FIGS. 6 to 8 for the placing under axial tension with means for placing under radial tension other than those of FIGS. 6 to 8. Thus, these means of placing under axial tension may be used with the means for placing under radial tension described at FIG. 5 for which the air, instead of being introduced under pressure into the chamber 13, is sucked from the chamber 13a comprised between the diaphragm 12 and the screen 4. In this case, it is possible for example, to suck air from the jack from the other chamber to separate the rings 60, 61.

In another modification (not shown), relating to the method of illumination, the lamp 3 could be arranged so that it is inside the mandrel when the latter is withdrawn into the casing 1. In this case, the spacing ring 10 would be transparent, the pneumatic means would be located outside the mandrel and the screen 4 would be placed between the masking film 6 and the sleeve 16, the latter no longer having to be transparent.

It is apparent from the foregoing description, of various embodiments of the invention, that the screen is subject to actinic radiation whilst in a condition of axial and radial tension which is that used during printing. Thus there is no risk of deformation of the design between its being subjected to radiation and the operation of printing.

The invention is not limited to the embodiments which have been described; on the other hand, it is possible to devise various modifications without departing from its scope.

What is claimed is:

1. Machine for the production of a serigraphic screen from a blank tubular shaped woven fabric screen and a tubular masking film having transparent zones and opaque zones and bearing in the opaque zones the design to be printed in ink from the serigraphic screen, wherein the improvement comprises first means for supporting the tubular screen and the tubular masking film in a cylindrical form with the tubular masking film in surface contact with the tubular screen, said first means including a cylindrically shaped first support surface and a cylindrically shaped second support surface located radially outwardly from said first support surface and providing a space therebetween for the tubular screen and the masking film, second means connected to said first means and operable in the space between said first and second support surfaces for axially and radially stretching the tubular screen and masking film under the conditions of tension to be applied to the finished screen when it is used for printing, and means for directing actinic radiation through the masking film to the tubular screen so that the radiation only affects the portion of the tubular screen corresponding to the transparent zones in the masking film.

2. Machine, as set forth in claim 1, wherein said second means comprises pneumatic means connected to the space between said first and second support surfaces for stretching the tubular screen in the axial direction of its cylindrical form and in the radial direction outwardly from said first support surface toward said second support surface.

3. Machine, as set forth in claim 1, wherein said first means comprises a cylindrically shaped support mandrel including said first support surface with said first support surface arranged to support the tubular screen and the masking film with the masking film located radially outwardly from the tubular screen, said first support surface being flexible and said second support surface being rigid so that under the effect of said second means said first support surface moves radially outwardly forcing the masking film and the tubular screen against said support surface.

4. Machine, as set forth in claim 3, wherein said mandrel includes a sleeve-like ring spaced radially inwardly from said first support surface and combining therewith to form an hermetic and deformable pneumatic chamber connected to said second means comprising pneumatic means with the pneumatic means being controlled for urging the tubular screen and masking film supported on said first support surface against said second support surface.

5. Machine, as set forth in claim 4, wherein said pneumatic means being arranged for admitting air under pressure into the hermetic and deformable pneumatic chamber for deforming said first support surface radially outwardly and placing the masking film and tubular screen in contact with the radially inner surface of said second support surface.

6. Machine, as set forth in claim 3, wherein said mandrel includes a sleeve-like ring located radially inwardly from said first support surface and combining therewith to form an annular shaped chamber therebetween, said first and second support surfaces being secured on said mandrel for forming a hermetic and deformable pneumatic chamber therebetween, said second means comprising pneumatic means joined to said hermetic and deformable pneumatic chamber and arranged to create a suction in said penumatic chamber with the chamber between said first support surface and said sleeve-like ring being exposed to normal air pressure and said first support surface comprising a deformable wall which under the suction action afforded by said pneumatic means presses the tubular screen and masking film outwardly against said second support surface.

7. Machine, as set forth in claim 3, wherein said second support surface is an inextensible and transparent sleeve mounted on said mandrel, said first support surface positioned radially inwardly of said inextensible and transparent sleeve and being formed of a deformable material and forming therebetween a chamber, and said inextensible and transparent sleeve being arranged between said means for directing actinic radiation and the chamber formed between said inextensible and transparent sleeve and said first support surface.

8. Machine, as set forth in claim 7, wherein said mandrel comprises two spaced end flanges extending transversely of the cylindrical axis thereof and a spacing ring connecting said end flanges, said spacing ring being positioned radially inwardly of said first and second support surfaces.

9. Machine, as set forth in claim 7, wherein said second means comprises pneumatic means and said pneumatic means include means for preventing the deformation of said deformable first support surface when said transparent sleeve forming said second support surface is not in position.

10. Machine, as set forth in claim 1, including a closed casing enclosing said first means said second means and said means for directing actinic radiation, said first means being slidably mounted within said closed casing and being displaceable between an extended position outwardly from said closed casing and a retracted position within said closed casing so that in the retracted position said means for directing actinic radiation comprising a lamp located within said casing can direct the actinic radiation through the masking film to the tubular screen.

11. Machine, as set forth in claim 10, wherein said first means are rotatably mounted within said closed casing around a fixed axis so that upon rotation of said first means the whole circumferential peripheral surface thereof can be exposed to the actinic radiation from said lamp.

12. Machine, as set forth in claim 10, wherein a sliding carriage is located within said closed casing for mounting said first means and a motor mounted on said sliding carriage and connected to said first means for rotating said first means.

13. Machine, according to claim 1, including a casing enclosing said first means, said second means and said means for directing actinic radiation, said means for directing actinic radiation including a lamp, a support for said first means for displacing said first means between an emerged position located exteriorly of said casing and a retracted position located within said casing, and means located within said casing for preventing the escape of rays from said lamp between said support and said casing for any position of said support.

14. Machine, as set forth in claim 1, wherein said first means includes support means for receiving and holding endless belts formed on the opposite transverse ends of the tubular screen.

15. Machine, as set forth in claim 14, wherein said support means comprises two coaxial rings disposed apart in the axial direction of the tubular screen and each of said rings having a groove therein for receiving the endless belts on the opposite ends of the tubular screen, and a spacer for axially spacing said rings apart.

16. Machine, as set forth in claim 15, wherein each of said rings comprises two parts with the grooves therein formed in the outer circumferential peripheral surfaces thereof.

17. Machine, as set forth in claim 15, wherein said second support surface comprises a transparent sleeve and said sleeve having a groove at each of its opposite transverse ends complementary to the grooves on said rings for receiving the endless belts on the tubular screen.

18. Machine, as set forth in claim 17, wherein the grooves in said rings having a width slightly less than the width of the belts on the tubular screen.

19. Machine, as set forth in claim 15, wherein one of said rings is fixed on said first means, and said first means includes spacer means for spacing said rings apart in the axial direction thereof.

20. Machine, as set forth in claim 19, wherein said second support surface comprises a sleeve coaxial with said rings, the fixed one of said rings being in abutment against one end of said sleeve and the movable one of said rings being mounted on said sleeve for slidable movement thereon.

21. Machine, as set forth in claim 19, wherein said first means comprises a fixed member supporting said movable said ring and screws connected to said movable said ring and to said fixed part for axially displacing the movable said ring relative to the fixed said ring.

22. Machine, as set forth in claim 19, wherein said first means includes a fixed part, and said means for spacing said rings apart comprises pneumatic jacks secured to said fixed means and to said movable one of said rings.

23. Machine, as set forth in claim 22, wherein each of said pneumatic jacks comprises a rod extending in the axial direction of said rings and bearing at one end against said fixed part.

* * * * *